United States Patent [19]
Bringol et al.

[11] 3,936,805
[45] Feb. 3, 1976

[54] DICTATION SYSTEM FOR STORING AND RETRIEVING AUDIO INFORMATION

[75] Inventors: Charles Ronald Bringol; Denis Earl Lowry; Charles Luther Ridings, all of Austin, Tex.

[73] Assignee: International Business Machines Corporation, Armonk, N.Y.

[22] Filed: Dec. 26, 1973

[21] Appl. No.: 427,755

[52] U.S. Cl. .............................................. 340/172.5
[51] Int. Cl.[2] ............................................ G06F 3/16
[58] Field of Search ....... 340/172.5, 173 R, 173 FF, 340/173 RC

[56] References Cited
UNITED STATES PATENTS

| | | | |
|---|---|---|---|
| 3,293,612 | 12/1966 | Ling | 340/172.5 |
| 3,293,613 | 12/1966 | Gabor | 340/172.5 |
| 3,302,185 | 1/1967 | Cox, Jr. et al. | 340/172.5 |
| 3,319,228 | 5/1967 | Apple | 340/172.5 |
| 3,333,247 | 7/1967 | Hadley et al. | 340/172.5 |
| 3,636,519 | 1/1972 | Heath | 340/172.5 |
| 3,648,255 | 3/1972 | Beausoleil et al. | 340/172.5 |
| 3,654,619 | 4/1972 | Tishman | 340/172.5 |
| 3,654,622 | 4/1972 | Beausoleil | 340/172.5 |
| 3,662,348 | 6/1972 | Weiss | 340/172.5 |
| 3,681,756 | 8/1972 | Burkhard et al. | 340/172.5 |

*Primary Examiner*—Gareth D. Shaw
*Assistant Examiner*—John P. Vandenburg
*Attorney, Agent, or Firm*—James H. Barksdale, Jr.

[57] ABSTRACT

A medialess dictation system for storing and retrieving audio information, and eliminating media handling requirements as well as recording and transcribing delays. During a recording operation, incoming audio information from an operator station is converted to digital information and temporarily stored in a limited capacity store. From the temporary store, this information is indexed and stored in a primary store. For a transcribing or playback operation wherein desired portions of previously recorded and indexed information are to be retrieved, the desired indexed information is addressed and transferred back to the temporary store. Thereafter, it is converted back to audio and output through the operator station.

18 Claims, 15 Drawing Figures

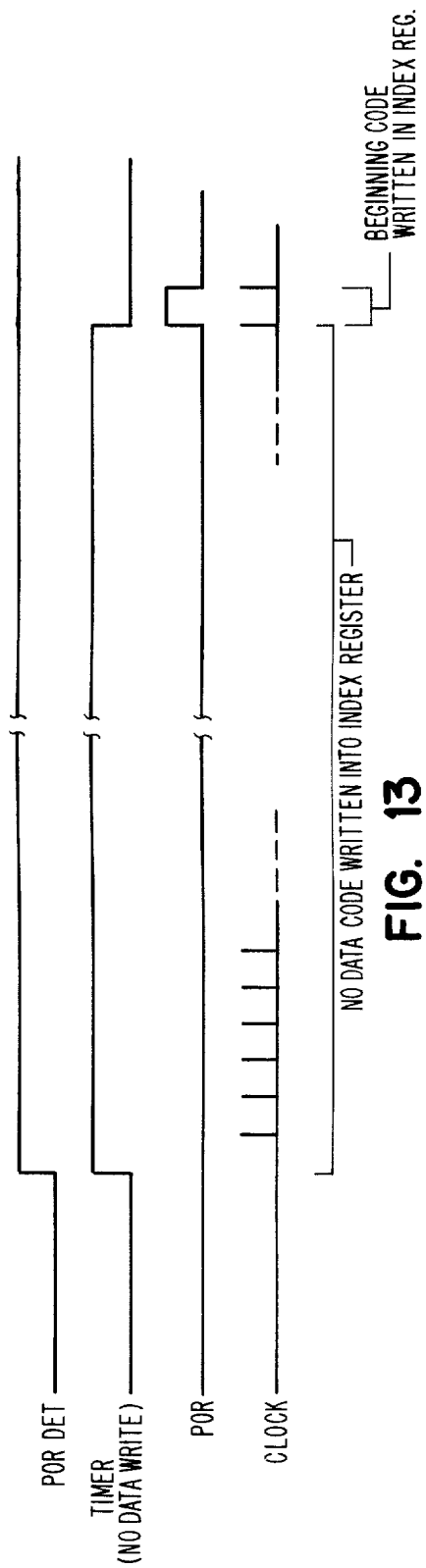
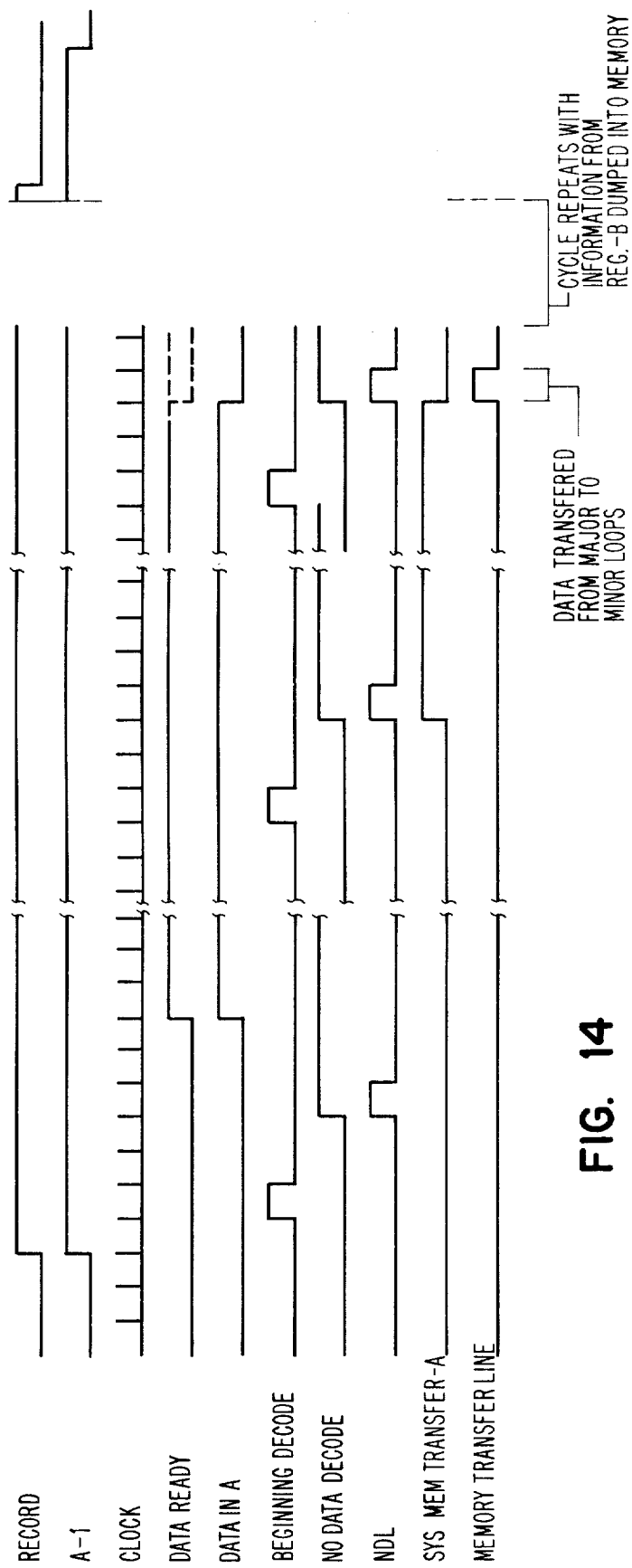
FIG. 13
FIG. 14

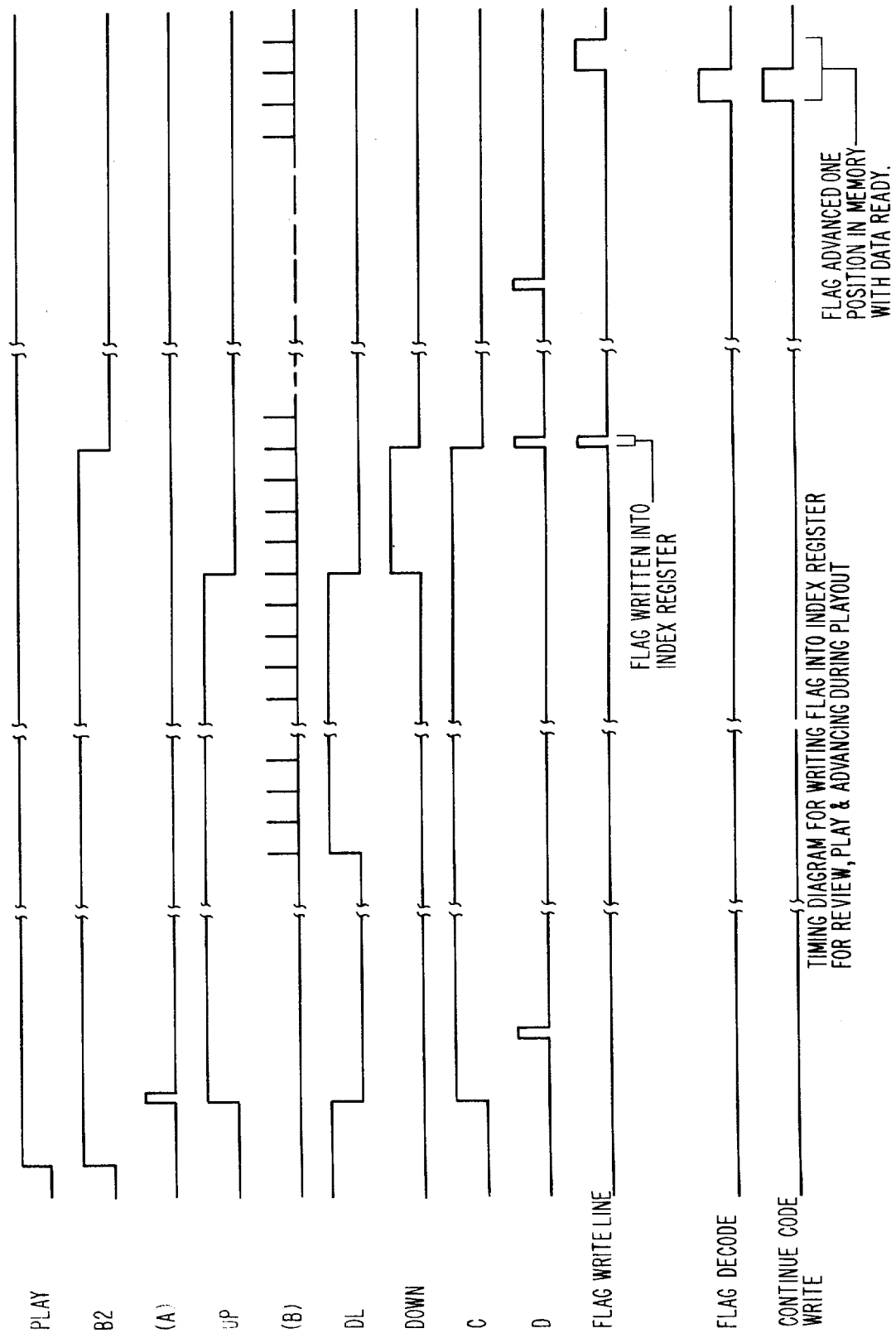

DICTATION SYSTEM FOR STORING AND RETRIEVING AUDIO INFORMATION

BACKGROUND OF THE INVENTION

1. Field of the Invention

This invention relates generally to dictation systems, and more specifically to a medialess dictation system wherein electronic storage devices and means are used for eliminating media handling and delay.

2. Description of the Prior Art

The conversion of audio information to digital information, as well as the conversion of digital information to audio information, is well known. Also, dictation systems using belts, etc. as recording media are well known. As yet, there are no known dictation systems in the prior art wherein A/D and D/A conversion techniques are used in conjunction with temporary and primary electronic stores controlled such that recording and transcribing delays do not present a burdensome problem. Data retrieval delays are, at present, excessive. This is particularly the case when selected portions of previously recorded material are to be retrieved and transcribed.

SUMMARY OF THE INVENTION

A medialess dictation system is provided for storing and retrieving audio information, and eliminating media handling as well as recording and transcribing delays. The system is primarily made up of an A/D converter, a D/A converter, two limited capacity registers, a primary store and included index register, and a control unit. During a recording operation, incoming audio information from an operator station is converted to digial information by the A/D converter and transferred to an available one of the limited capacity registers. When the capacity of the limited capacity register being loaded is reached, the contents thereof are transferred to the primary store and indexed. During this transfer, the other limited capacity register is loaded with succeeding incoming information. That is, the two limited capacity registers are alternately loaded and unloaded. The control of the loading and unloading of the limited capacity registers is through the control unit. When a transcribing operation is to be performed, the information stored in the primary store is alternately transferred back to the limited capacity registers under the control of the control unit. During the reloading of one of the limited capacity registers, the contents of the other can be transferred to the D/A converter for converting the digital information back into audio information for output to the operator station.

BRIEF DESCRIPTION OF THE DRAWING

FIG. 13 is a timing diagram of the "power on" sequencing for FIG. 10;

FIG. 14 is a timing diagram for recording logic of FIG. 11; and

FIG. 15 is a timing diagram for the play logic for FIG. 12.

DESCRIPTION OF THE PREFERRED EMBODIMENT

Figure 1:
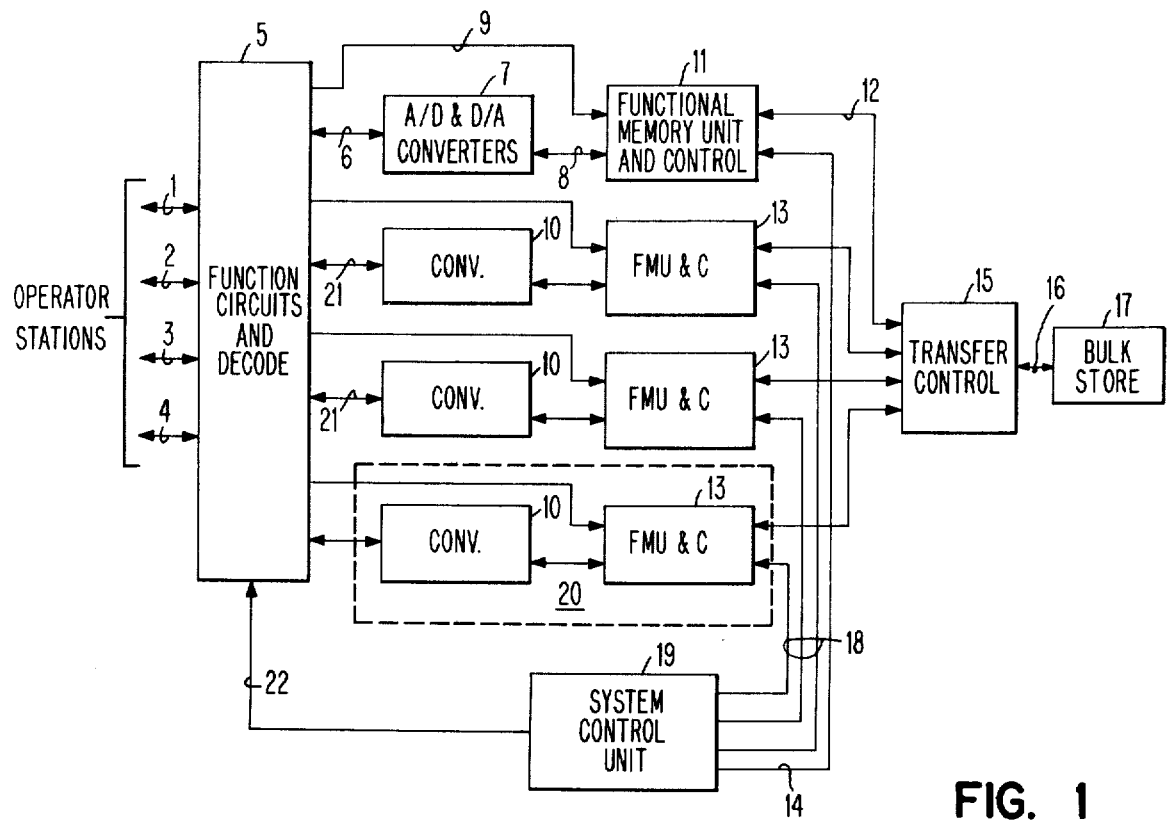
FIG. 1 is an overall block diagram of a medialess dictation system according to this invention.

Reference is first made to FIG. 1 wherein there is shown an overall block diagram of the system according to this invention. Operator stations 1–4 are in two-way communication with function circuits and decode block 5. The operator stations can be telephones (remote or internal dial or pushbutton), microphones (as used with the Model 271 IBM "Executary" Recorder), etc.. Function circuits and decode block 5 is in two-way communication with A/D and D/A (audio to digital and digital to audio) converters block 7 along line 6. Function circuits and decode block 5 also communicates with function memory unit and control block 11 along line 9 for controlling such operations as record and playback as will be described in more detail later in the specification. A/D and D/A converters block 7 is in two-way communication along line 8 with function memory unit and control block 11 which in turn is in two-way communication along line 12 with transfer control block 15. Transfer control block 15 is in two-way communication along line 16 with bulk store block 17. Below blocks 7 and 11 and lines 6, 8, 9, and 12 are identical blocks and lines, such as, for example, 10, 13, and 21. This same combination is included in hatched block 20 and is set out in more detail in FIG. 2. *Registered Trademark, International Business Machines Corporation Each of the equivalents of hatched block 20 are either dedicated to, or accessible by, the operator stations 1–4. For example, blocks 7 and 11 could be dedicated only to station 1, or could be accessible by any of the other stations. The control of the function circuits and decode block 5 in terms of accessing is through system control unit 19 along line 22. For this purpose, system control unit 19 is also connected to function memory unit and control blocks 11 and 13 along lines 14 and 18, respectively. Although system control unit 19 has been set out separately, limited functions could readily be handled by commercially available block 5.

Figure 2:
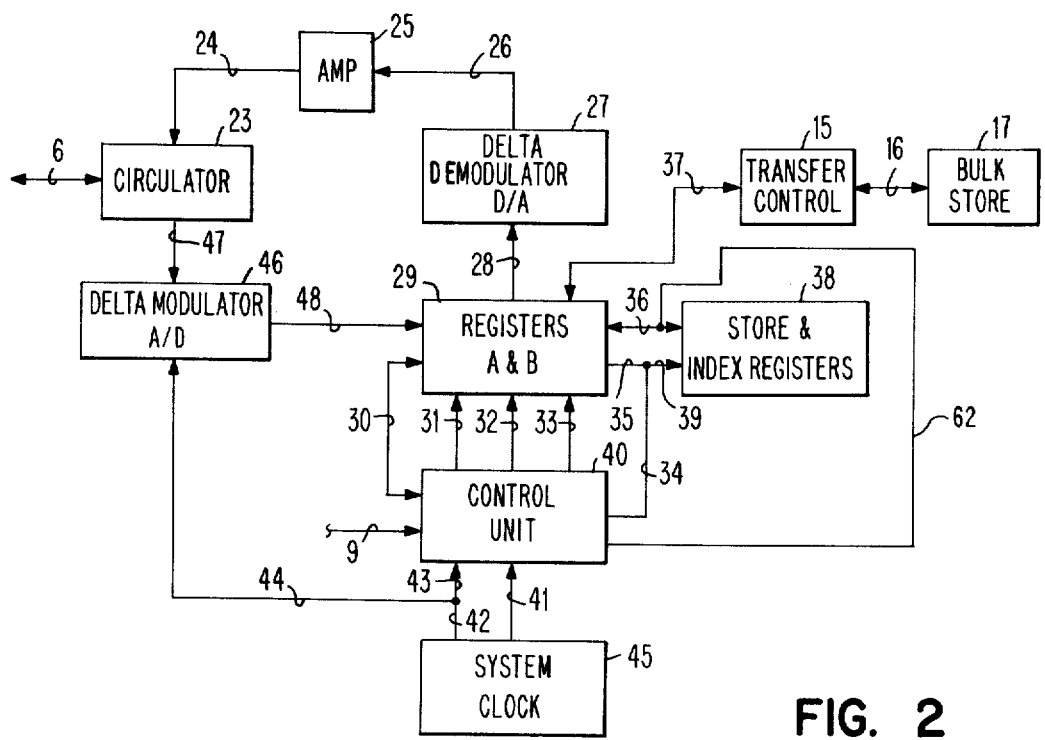
FIG. 2 is a block diagram primarily illustrating the structure included in the hatched block in FIG. 1.

For a more detailed breakdown of the structure included in hatched block 20 of FIG. 1, reference is next made to FIG. 2. During a recording operation, audio data or information will appear on line 6. This information will pass through circulator 23 and along line 47 to delta modulator 46. In modulator 46 the audio data is converted to digital data. Although delta modulators and demodulators are used herein, any commercially available audio-digital and digital-audio conversion apparatus would suffice. The output of delta modulator 46 is along line 48 to registers A and B, designated by reference numeral 29. Registers A and B are temporary stores as will be further described with reference to FIG. 3. The control of the incoming converted audio for temporary storage in registers A and B is controlled by control unit 40 along lines 30, 31, 32 and 33. Line 31 is for controlling the selection between registers A and B. Lines 32 and 33 are for controlling the clock rate for inputting data into registers A and B. Control unit 40 is in two-way communication with registers A and B along line 30 for determining the "ready" condition and selection of registers A and B. The high rate or system clocking between registers A and B and store and index registers 38 is along line 36. This is controlled by control unit 40 along line 62. The store and index registers 38 provide for indexing and more permanent storage as set out below. The transfer control between registers A and B and store and index registers 38 is along lines 34, 35, and 39 for data transfer along lines 35 and 39. A system clock 45 provides both low and high rate clocking. Low rate clocking for data transfer into delta modulator 46 and between delta modulator 46 and registers A and B is along lines 42 and 44, and 42 and 43, respectively. The system clock rate is applied to control unit 40 along line 41. System clock 45 can be a standard counter controlled clock wherein every clock pulse is applied along line 41 and every tenth, for example, clock pulse is applied along lines 42, 43, and 44. The counter for controlling the low rate clocking can be a resettable counter structured to count to ten and automatically reset.

Also illustrated again is transfer control 15 and bulk store 17. Transfer control 15 is in two-way communication with registers A and B along line 37 which is equivalent to line 12 in FIG. 1.

For review, digital data can be transferred from bulk store 17 along line 16, through transfer control 15, and along line 37 into registers A and B, or to registers A and B along line 36 from store and index registers 38. The difference between bulk store 17 and store and index registers 38 in terms of function and structure can be that bulk store 17 is a recording belt and store and index registers 38 is an electronic cyclic memory. As is readily implied from the foregoing, store and index registers 38 are for storing information for immediate processing and bulk store 17 is for more permanently storing the information. Transfer control 15 is for controlling the transfer of information to bulk store 17. The data is then transferred along line 28 from registers A and B, under the control of control unit 40, to delta demodulator 27. Demodulator 27 will convert digital data back to audio. The converted digital (audio) data is applied along line 26 to amplifier 25, and then along line 24 to circulator 23. From circulator 23, the audio data is applied along line 6.

Figure 3:
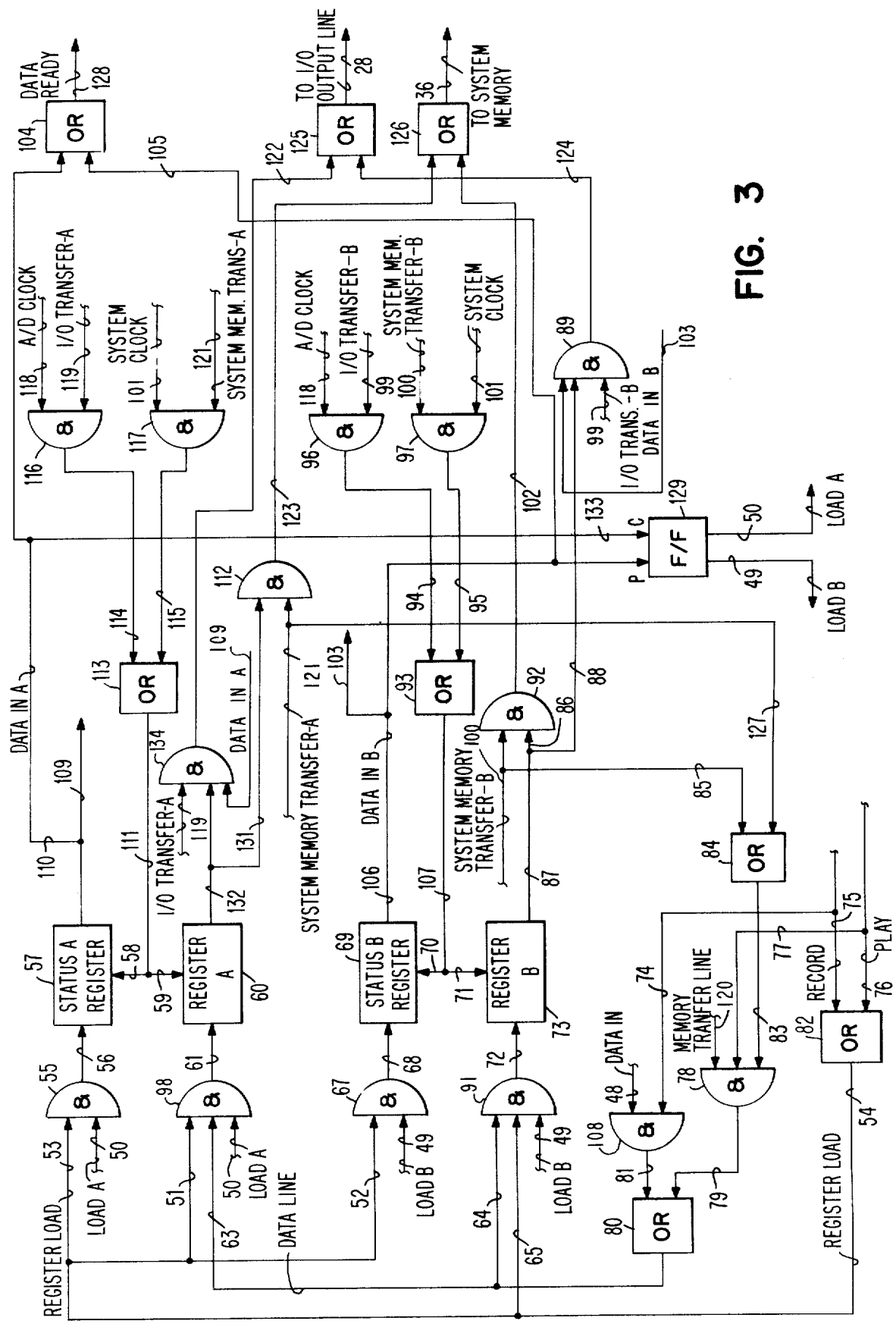
FIG. 3 is a more detailed illustration of the structure of the limited capacity registers A and B and control unit set out in FIG. 2.

For a more detailed description of registers A and B (29) and control unit 40, reference is next made to FIG. 3. The mode control line 9 in FIGS. 1 and 2 is represented by the record and play lines 75 and 76 in FIG. 3. For a record operation, a signal is applied along line 75 to OR gate 82. The output of OR gate 82 is a register load signal applied along line 54. This signal is also applied along line 53 to AND gate 55, line 51 to AND gate 98, line 52 to AND gate 67, and line 65 to AND gate 91. The record signal is also applied along line 74 to AND gate 108.

Hereinafter with reference to this figure, all references to inputs, outputs, signals, etc., are to be taken as "up" signals, "one" conditions, or positive logical levels unless otherwise indicated. In the same light, a zero is to be taken as a "down" signal or negative logical level.

It will now be assumed that power has just been turned on and no data has been stored in register A, designated by reference numeral 60. Flip-flop 129 will have been "cleared" and a load A signal applied along line 50 to AND gates 55 and 98. The output of AND gate 55 is along line 56 to status A register 57. Status A register 57 is a storage device of equal length to register A, and is used for determining the capacity of register A. That is, status A register 57 is initially loaded with all zeros. Upon the loading of register A, for each bit loaded thereinto, a corresponding 1 bit will be loaded into status A register 57. Flip-flop 129 is preset and cleared according to the one and zero outputs of status A register 57 (along lines 110 and 133) and status B register 69 (along line 106). The loading of both register A and status A register 57 is determined and controlled by clock pulses or signals applied along lines 58 and 59. These signals are from the A/D clock and are applied along line 118. They will be gated through AND gate 116 when an I/O transfer A signal is applied along line 119. The output of AND gate 116 is applied along line 114, through OR gate 113, and along line 111.

The initial conditions are now met for performing a recording operation. Incoming digital (converted audio) data is applied along line 48 (FIGS. 2 and 3) to AND gate 108, and then along line 81 through OR gate 80. This data is then applied along the data line 63 to AND gate 98. Since the conditions are now met for gating data through AND gate 98, the data is transferred along line 61 to register A. As each data bit ("zero" or "one") is input into register A, a corresponding logical one bit will be input into status A register 57. When a 1 bit is detected at the output of status A register 57, the capacity of register A will have been reached. When this occurs, the contents thereof are ready for transfer along the system memory line 36 and subsequent incoming data along line 48 will be stored in register B. Register B is designated by reference numeral 73. During the loading of register B, a signal will be applied along system memory transfer A line 121 to AND gate 112. The conditions are now met for gating the data stored in register A along lines 132 and 131 and through AND gate 112. The output of AND gate 112 is along line 123, through OR gate 126, and along line 36 (FIGS. 2 and 3) to the system memory. The system memory, designated as store and index registers 38 in FIG. 2, will be more fully described primarily with reference to FIGS. 8 and 9. The gating of data into register A, as described above, is at the A/D or a low clock rate. The gating of data out of register A and along line 36 is at the system or a high clock rate. A one bit at the output of status A register 57 will result in a signal applied along lines 110 and 133 to flip-flop 129. A load B signal will now be output from flip-flop 129. The signal applied along the system memory transfer A line 121 to AND gate 112 is also applied to AND gate 117. The conditions are now met for the output from register A along line 36 at the system clock rate. That is, system clock pulses at the system clock rate are applied along line 101, through ANd gate 117, along line 115, through OR gate 113, and along lines 111, 58, and 59 to status A register 57 and register A. The clock signals thus applied to status A register 57 will reload it with zeros as data is output from register A.

The signal applied along line 49 from flip-flop 129 is applied to AND gates 67 and 91. The incoming data along line 48 is now applied along line 64, through AND gate 91, and along line 72 for storage in register B.

The output of zeros from status A register 57 during the loading of register A will result in signals applied along the data in A line 110, through OR gate 104, and along the data ready line 128. The same result will be effected with respect to status B register 69. That is, zeros appearing at the output of status B register 69 result in signals applied along lines 106 and 105, through OR gate 104, and along the data ready line 128. The data ready line will be described in more detail later in the specification when reference is made to subsequent figures. Status B register 69 and register B, designated by reference numeral 73, are identical to status A register 57 and register A. Also, the control of status B register 69 and register B is similar to that described with reference to status A register 57 and register A. That is, status B register 69 is a storage device of equal length to register B, and is used for determining the capacity of register B. Status B register 69 is initially loaded with all zeros. Upon the loading of register B, for each bit loaded thereinto, a corresponding 1 bit will be loaded into status B register 69. The loading of both register B and status B register 69 is determined and controlled by clock pulses or signals applied along lines 70 and 71. These signals are A/D clock signals applied along line 118 and gated through AND gate 96 when an I/O transfer B signal is applied along line 99. The output of AND gate 96 is applied along line 94, through OR gate 93, and along line 107. Incoming digital data is applied along line 48 to AND gate 108 and then along line 81 through OR gate 80. This data is then applied along the data line 64 to AND gate 91. Since the conditions are now met for gating data through AND gate 91, data is transferred along line 72 to register B. As each data bit is input into register B, a corresponding logical 1 bit will be input into status B register 69. When a 1 bit is detected at the output of status B register 69, the capacity of register B will have been reached. The contents thereof are now ready for transfer along the system memory line 36 and subsequent incoming data along line 48 will be stored in register A.

During the loading of register A, a signal will be applied along system memory transfer B line 100 to AND gate 92. The conditions are now met for gating the data stored in register B along line 87, through AND gate 92, and along line 102 to OR gate 126. The output of OR gate 126 is along line 36 to the system memory.

The gating of data into register B, as described above, is at the A/D or a low clock rate. The gating of data out of register B and along line 36 is at the system or a high clock rate. A 1 bit at the output of status B register 69 will result in a signal applied along line 106 to flip-flop 129. The output of flip-flop 129 is now applied along line 50. The signal applied along the system memory transfer B line 100 to AND gate 92 is also applied to AND gate 97. The conditions are now met for the output from register B along line 36 at the system clock rate. That is, system clock pulses at the system clock rate are applied along line 101, through AND gate 97, along line 95, through OR gate 93, and along lines 107, 70, and 71 to status B register 69 and register B. The clock signals thus applied to status B register 69 will reload it with zeros as the data is output from register B.

The signal applied along line 50 from flip-flop 129 is applied to AND gates 55 and 98. The incoming data along line 48 is now applied along line 63, through AND gate 98, and along line 61 for storage in register A.

The output of zeros from status B register 69 during the loading of register B will result in signals applied along the data-in B lines 106 and 105, through OR gate 104, and along the data ready line 128.

From the above, it is appreciated that, for example, data is initially loaded into register A until the capacity thereof has been reached, and then while the data is being transferred out of register A for more permanent storage, the incoming data is stored in register B. The temporary storage in either register A or B occurs while the other is being unloaded.

For a play (playback or transcribe) operation, data is to be transferred from the system memory along line 120 to AND gate 78. Another input to AND gate 78 is the play signal applied along line 76 to line 77. The other input to AND gate 78 is either the system memory transfer A signal applied along lines 121 and 127, through OR gate 84, and along line 83, or the system memory transfer B signal applied along lines 100 and 85, through OR gate 84, and along line 83. With the conditions met for gating data through AND gate 78, the data is applied along line 79, through OR gate 80, and along either lines 63 or 64 for storage in the available one registers A and B. The loading and unloading of registers A and B, in terms of control, is opposite that described above. That is, the loading of these registers is at the system clock rate and the unloading thereof is at the A/D clock rate. The lines and logical elements used are the same. Only the timing for application of various of the signals is reversed. For example, when the capacity of register A has been reached, subsequent incoming data is stored in register B. During storage in register B, the data in register A is gated out at the A/D clock rate along line 28 (FIGS. 2 and 3) to the I/O output line. This is controlled by inputs to AND gate 134. That is, a signal is applied along the I/O transfer A line 119. The data in A signal is applied along line 109 to AND gate 134. With these signals applied to AND gate 134, data in register A is gated along line 132, through AND gate 134, along line 122, through OR gate 125, and along line 28 to the I/O output line.

In like manner during the loading of register A, data is gated out of register B and along lines 87 an 88, through AND gate 89, along line 124, through OR gate 125, and along line 28 to the I/O output line 28. The other inputs to AND gate 89 are along the I/O transfer B line 99 and the data in B line 103.

Figure 4:
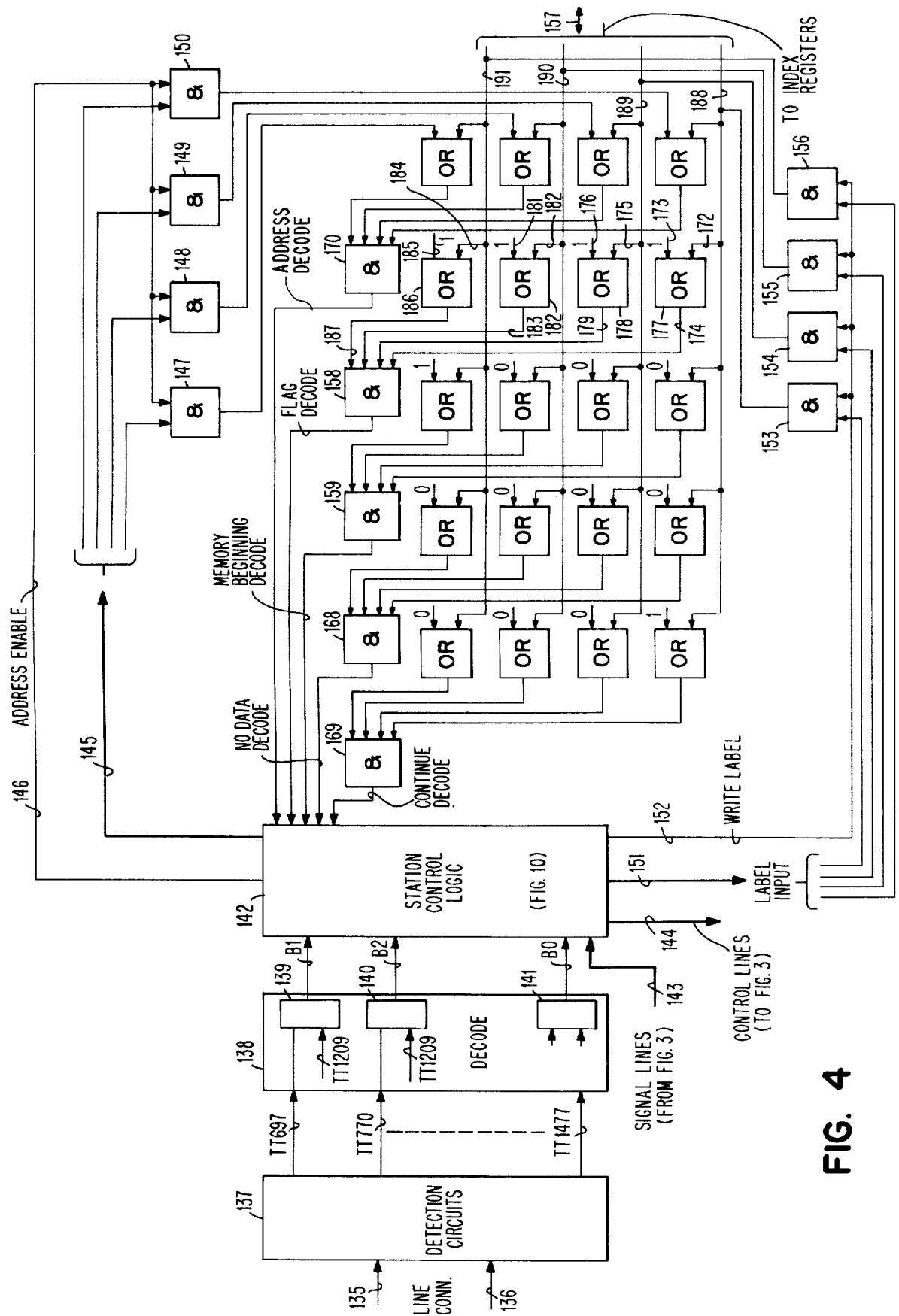
FIG. 4 illustrates that portion of the structure of the control unit used for addressing, and writing control codes into, the index registers portion of the store and index registers set out in FIG. 2.
Figure 5:
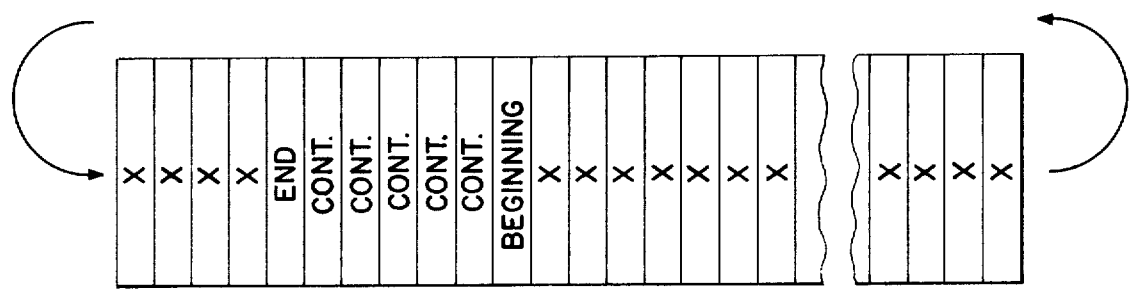
FIG. 5 illustrates a control code organization for the index registers portion of the store and index registers set out in FIG. 2.
Figure 6:
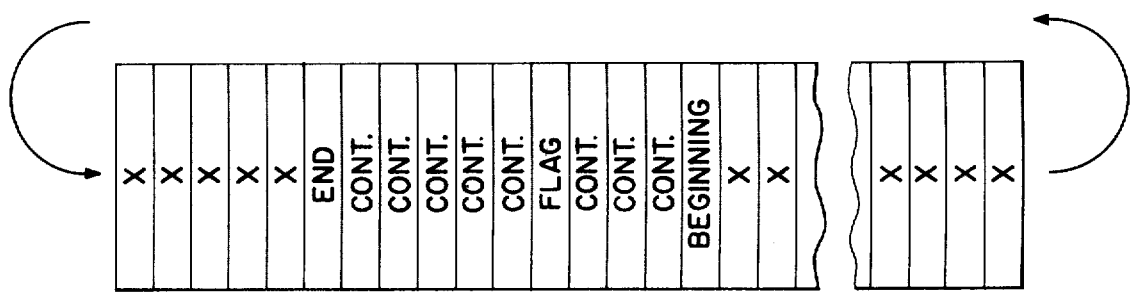
FIG. 6 illustrates another control code organization for the index registers.
Figure 7:
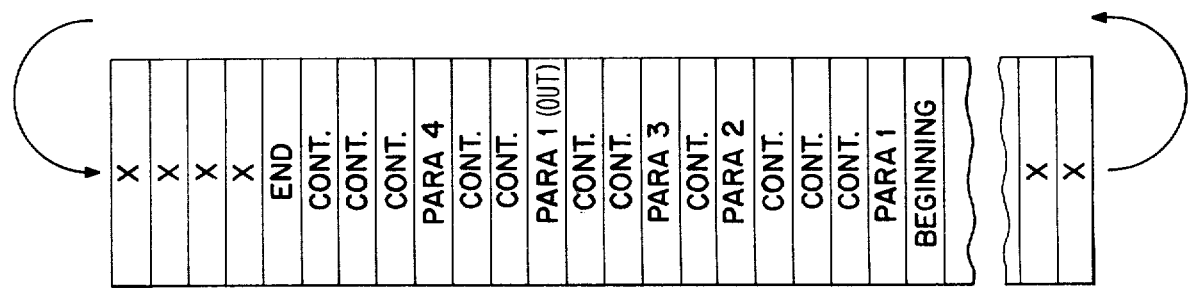
FIG. 7 illustrates yet another control code organization for the index registers.

Referring next to FIG. 4 there is illustrated the interconnections between an operator station, such as 1 in FIG. 1, and station control logic 142. For this illustration, it is assumed that a pushbutton telephone system is used. Line connections 135 and 136 are to pushbutton detection circuits 137. Detected frequencies are applied to decode 138 made up of a number of AND gates, such as 139, 140, and 141. These AND gates are used for decoding and determining the particular button on a pushbutton telephone which has been pushed down. Upon decode, signals are applied along lines B1, B2, — B0 to station control logic 142. Station control logic 142 will be more fully described with reference to FIG. 10. Other inputs to station control logic 142 are the data in A and data in B signals applied along line 143 from line 128 in FIG. 3. The output buss 144 from station control logic 142 is made up of lines along which the system memory transfer A, system memory transfer B, I/O transfer A, I/O transfer B, record, and play signals are applied to FIG. 3. Another output line from station control logic 142 is the address enable line 146, along which signals are applied to AND gates 147, 148, 149, and 150. Yet another output line from station control logic 142 is line 145 along which signals are applied for controlling the outputs from AND gates 147–150. Lines 145 and 146 are for addressing and enabling the addressing of control codes stored in the index registers of store and index registers 38 (FIG. 1) and appearing on buss 157. Control code arrangements are illustrated in FIGS. 5–7 and will be more fully described with reference thereto. With four index registers being used for storing control codes, bits defining the control codes appear in parallel on lines 188 through 191. For decoding, these bits are applied through an exclusive OR gate and AND gate arrangement. AND gates 169, 168, 159, 158, and 170 receive inputs from the exclusive OR gates. As an example of the use of this arrangement, an output from AND gate 169 can be a continue decode signal, an output from AND gate 168 can be a no data decode signal, an output from AND gate 159 can be a memory beginning decode signal, an output from AND gate 158 can be a flag decode signal, and an output from AND gate 170 can be an address decode signal. These signals are applied to station control logic 142. The exclusive OR gate tier made up of exclusive OR gates 186, 182, 178 and 177 and the identical three tiers of exclusive OR gates to the left thereof are controlled by fixed inputs such as logical 1 bits applied along lines 185, 181, 176, and 173. The other inputs to exclusive OR gates 186, 182, 178, and 177 are bits applied along lines 191 and 184, 190 and 182, 189 and 175, and 188 and 172, respectively. The output from exclusive OR gates 186, 182, 178, and 177 are along lines 187, 183, 179, and 174, respectively, to AND gate 158 for flag decoding.

When it is desired to write labels or index codes into the index registers, label input signals are applied along line 151 to AND gates 153, 154, 155, and 156. The other input to AND gates 153 through 156 is the write label or enabl signal along line 152 from station control logic 142. The control code outputs from AND gates 153 through 156 are applied along lines 188 through 191 and then along line 157 for storage in the index registers.

The store and index registers 38 represented in FIG. 2 are preferably made up of a magnetic bubble domain arrangement or bubble memory. It is to be appreciated that other storage means, such as random access memories, electronic dynamic shift registers, etc., could be used. The bubble memory arrangement preferred herein is made up of a major loop, and a number of minor loops of which a dedicated number are used as index registers. With the major/minor loop concept, data is shifted into an $n$ bit major loop until the data occupies every position therein and then the data is simultaneously transferred in parallel to the minor loops. If the minor loops contain an integer multiple (or divisor) of positions relative to the major loop, synchronism of information looping and transfer is maintained if all loops are clocked together. For this arrangement a $10^6$ memory could be organized using $10^3$ bits in the major loop and $10^3$ bits in each of the $10^3$ minor loops.

Figure 9:
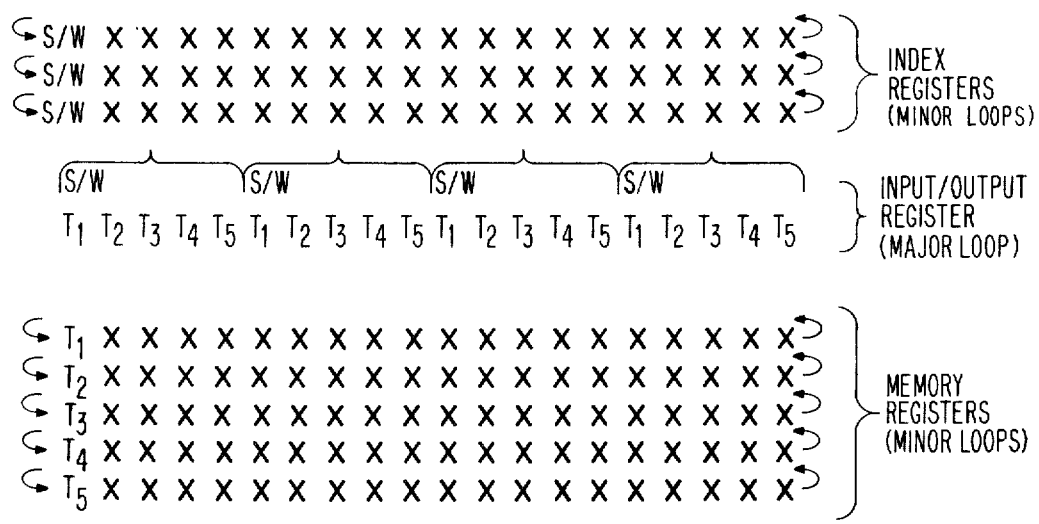
FIG. 9 is a pictorial representation of data flow in the bubble memory shown in FIG. 8.

An organization ($n = 5$, $m = 20$, where $n$ is equal to the number of bits in the major loop and $m$ the number of bits in the minor loop) of the store and index registers is shown with reference first to FIG. 9. The S/W positions in the index registers are where data is sensed and written in parallel. The $x$ positions are non-accessible. Clocking causes all data to shift to the right one position. The input register (major loop) repeats four times for each revolution of the index and memory registers (minor loops).

The operation of inputting data into the memory will now be described. Previously recorded index codes appear at index sense ports (line 157 in FIG. 4). If the code sensed or detected is a "beginning" code as illustrated in FIG. 5, the first bit of input data is input at the S/W point in the input register. This occurs on the clock time following the detection of the beginning code. On succeeding clock times, bits will be input until five bits have been entered. No additional data can be entered until transfer into the main memory registers (minor loops) is complete. Subsequent clocking causes data to be recirculated, and later in time (one revolution of the index to be recirculated, and later in time (one revolution of the index registers), the beginning code reappears. On the next clock pulse or time, a no-data code (not shown) is sensed. Upon power on, the memory is initially loaded with no data codes. At this time, all of the data in the input register (major loop) is transferred in parallel into the main memory registers and a continue code is written into the index registers. This is shown in FIG. 5 following the beginning code. If data is to be transferred from one of the previously described registers (A or B in FIG. 3), clocking into the input register begins by decoding the index registers for determining an available position. For the index register data flow shown in FIG. 5, dictation is stored in memory beginning with a beginning code, continuing with continue codes, and ending with an end code when a dictator leaves the record mode.

Information is retrieved from the memory in a similar manner. For example, if a review/play command is issued for a number of blocks of data, a position flag is written into the index registers. This flag is illustrated in the index register data flow of FIG. 6, and can be repositioned on later command. This command is issued by an operator holding a microphone control button in a review position for a time proportionate to the review time desired.

After the position flag has been written into the index registers, information is transferred from the memory registers to the input register and then to registers A and B for subsequent read-out. This transfer is at the minor loop or system clock rate.

When playing back (play), after the information has been transferred from the memory registers and the flag is again sensed, it is deleted and the previous code or index label is reinserted. On the next clock time, the memory is advanced and the flag can be written over the following code. Then data is transferred into the input/output register for transfer to registers A and B.

For paragraph or thought group dictation, the index register data flow can be as shown in FIG. 7. Dictation is begun with a paragraph number input by, for example, depressing a number on a pushbutton telephone. Succeeding paragraphs are identified by depressing defining numbers, such as 2 for paragraph 2, etc. The numbered paragraphs do not necessarily have to be in order, and additions can be made to these paragraphs. For example, an addition to paragraph 1 can be recorded following the recording of paragraphs 1, 2 and 3, and then paragraph 4 can be recorded. The labels in memory would be as shown in FIG. 7.

If paragraph 1 is to be reviewed, information is transferred beginning with paragraph 1, skipping paragraphs 2 and 3, and continuing with paragraph 1 until paragraph 4 is reached. Since the access time of any block of data is negligible, there are no noticeable gaps while playing back for reviewing previous dictation.

Figure 8:
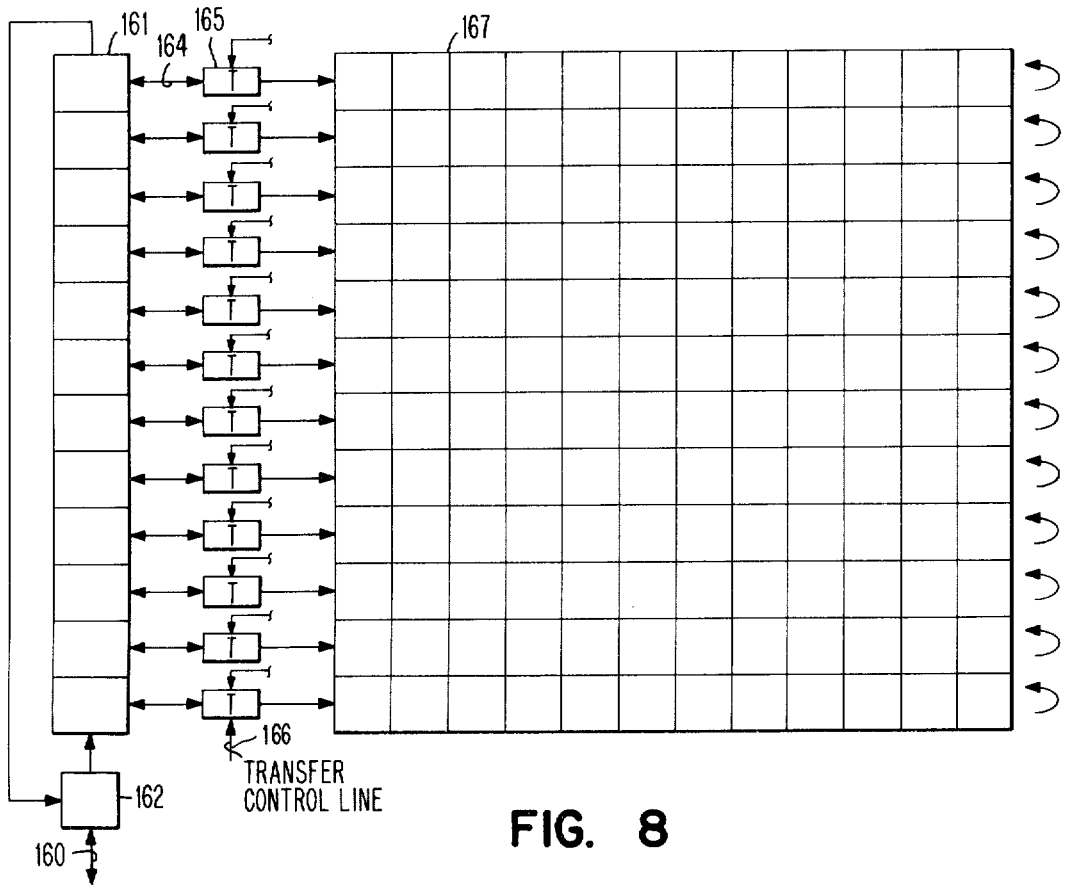
FIG. 8 illustrates a major/minor loop bubble memory organization making up the store and index registers set out in FIG. 2.

Referring next to FIG. 8 there is illustrated the major/minor loop organization of the bubble memory or shift registers. The major loop is designated by reference numeral 161. Data is transferred to and from major loop 161, along line 160, and through transfer control 162. When each of the data bit positions in major loop 161 have been filled, the contents thereof are transferred to the minor loops 167. Data bits are transferred to and from minor loops 167 and major loop 161 along lines 164 through transfer control units 165. The transfer control line 166 applied to each transfer control unit 165 controls this transfer.

Figure 10:
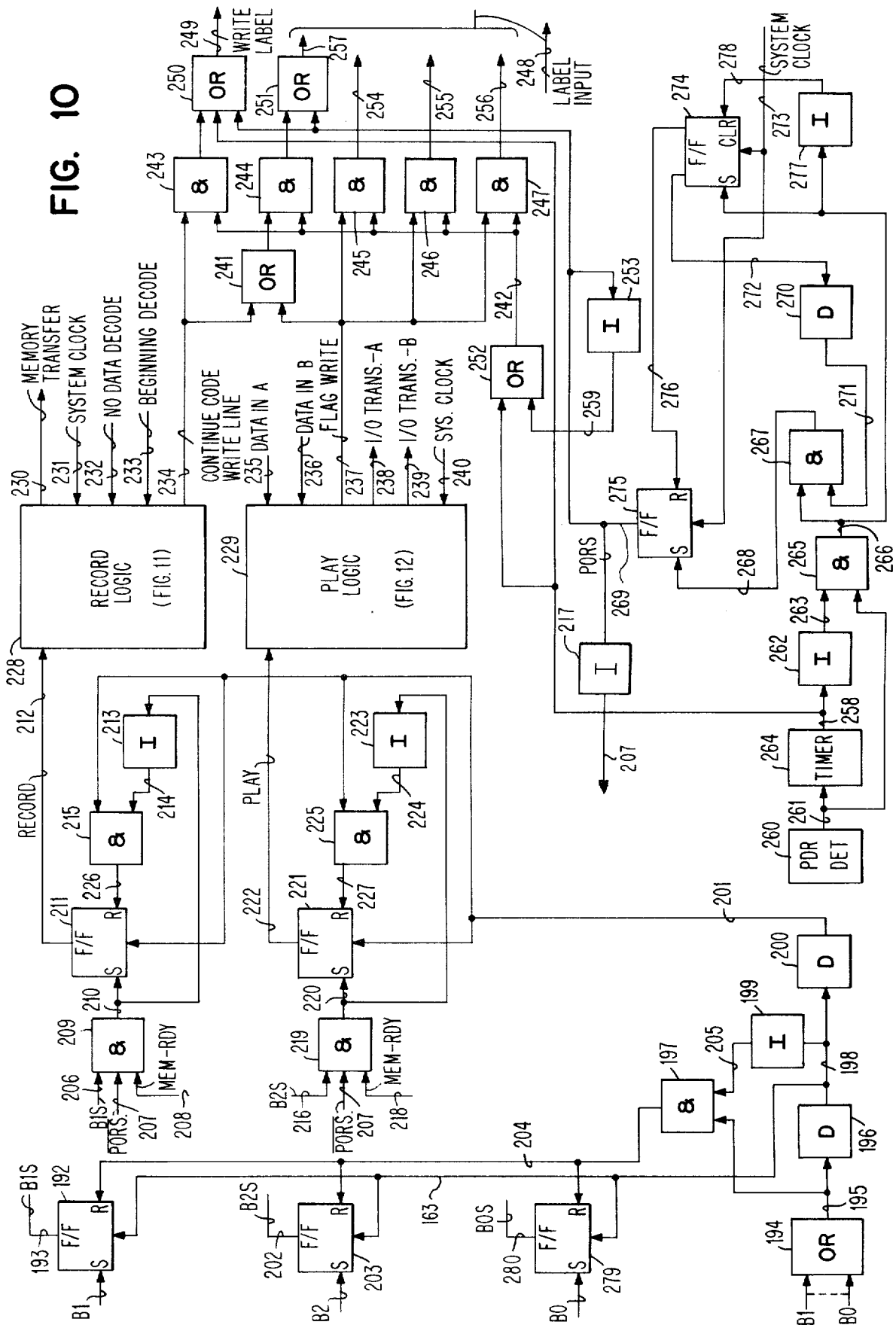
FIG. 10 sets forth in more detail the structure included in the station control logic of FIG. 4.

Referring next to FIG. 10 there is illustrated the structure of the station control logic 142 shown in FIG. 4.

The depression of any one of buttons B1 through B0 will result in signals applied to OR gate 194. These signals will also be applied to dedicated flip-flops. For example, if the "one" button on a pushbutton telephone is depressed, a signal is applied to OR gate 194 and also to flip-flop 192. The output of OR gate 194 is along line 195, through one bit delay 196, and along line 163 to flip-flop 192. This will result in the setting of flip-flop 192 and the application of a B1S signal along line 193. The output of one bit delay 196 is also applied along line 198 to inverter 199 and along line 205 to AND gate 197. The other input to AND gate 197 is along line 195. The output of AND gate 197 is along line 204 for resetting each of the dedicated flip-flops associated with non-depressed buttons. The B1S signal applied along line 193 is also applied along line 206 to AND gate 209. The other inputs to AND gate 209 are a NOT power-on reset signal along line 207 and a memory ready signal along line 208. The output of AND gate 209 is along line 210 to flip-flop 211 and inverter 213. The output of inverter 213 is along line 214 to AND gate 215. The other input to AND gate 215 is from one bit delay 196, along line 198, through one bit delay 200, and along line 201. The signal applied along line 201 to flip-flop 211 in conjunction with the signal applied along line 210 will result in the setting of flip-flop 211. When flip-flop 211 is set a record signal is applied along line 212 to record logic 228. Record logic 228 will be described in more detail with reference to FIG. 11. For now, other inputs and outputs from record logic 228 will be generally described. The inputs to record logic 228 are along the system clock line 231, the no data decode line 232, and the beginning decode line 233. The outputs from record logic 228 are along the memory transfer line 230 and the continue code write line 234. From the above, it is assumed that depression of the "one" button will define a recording operation.

It will now be assumed that a recording operation has been completed and that a review operation is in order. This will be defined by the depression of button 2. Upon depression of button 2, a signal will be applied to flip-flop 203 and OR gate 194. The setting and resetting of flip-flop 203 relative to other dedicated flip-flops will be the same as that described with reference to flip-flop 192. With flip-flop 203 set, a B2S signal is applied along line 202. This signal is also applied along line 216 to AND gate 219. The other inputs to AND gate 219 are the NOT power-on reset signal along line 207 and the memory ready signal along line 218. The output of AND gate 219 is along line 220 to flip-flop 221. With a signal applied along line 220 to flip-flop 221, flip-flop 221 will be set when a signal is applied along line 201 from one bit delay 200. Also, when flip-flop 221 is set a signal is applied along line 226 from AND gate 215 for resetting flip-flop 211. With flip-flop 221 set, a play signal is applied along line 222 to play logic 229. Play logic 229 will be described in more detail with reference to FIG. 12. For now, the other inputs and outputs relative to play logic 229 will only be generally described. The inputs are applied along the data in register A line 235, the data in register B line 236, and the system clock line 240. The outputs from play logic 229 are along the flag write line 237, the I/O transfer A line 238, and the I/O transfer B line 239.

The signals applied along the NOT power-on reset line 207 are derived from flip-flop 275 which is set and reset as the system is turned on and off and as operations change. The output of flip-flop 275 is along line 269 through inverter 217, and along line 207.

If the zero button is next depressed, a signal is applied to flip-flop 279 and to OR gate 194. Flip-flop 279 will be set when a signal is applied along line 198. When flip-flop 279 is set a B0S signal is applied along line 280. This would result in the resetting of flip-flop 221. That is, a signal is applied along line 201 to AND gate 225. The other input to AND gate 225 is along line 220 to inverter 223, and along line 224. The output of AND gate 225 is along line 227 for resetting flip-flop 221.

The output from record logic 228 along the continue code write line 234 is to AND gate 243. The other input to AND gate 243 originates from power-on detector 260. The output of power-on detector 260 is applied along line 261 to timer 264, an then along line 258 to OR gate 252. The output of OR gate 252 is along line 242 to AND gate 243. The output of AND gate 243 is through OR gate 250 and then along the write label line 249. The output from record logic 228 along the continue code write line 234 is also applied to OR gate 241. The output of OR gate 241 is applied to AND gate 244. The other input to AND gate 244 is along line 242. The output of AND gate 244 is applied through OR gate 251 and then along line 257. Line 257 forms part of the label input buss represented by line 248.

When power is turned on to the system, this is detected by power-on detector 260. As pointed out above, the output of power-on detector 260 is applied along line 261 to timer 264. The output of timer 264 is applied along line 258 to inverter 262, and then along line 263 to AND gate 265. The other input to AND gate 265 is along line 261 from power-on detector 260. The output of AND gate 265 is along line 266 to AND gate 267. The other input to AND gate 267 is derived initially from the system clock pulses applied along line 273 to flip-flop 274. These pulses in conjunction with the output from AND gate 265 along line 266 result in the setting of flip-flop 274. When flip-flop 274 is set a signal is applied along line 272 to one bit delay 270, and then along line 271 to AND gate 267, The output of AND gate 267 is along line 268 to flip-flop 275. The signal applied along line 268 in conjunction with the system clock pulses applied along line 273 will result in the setting of flip-flop 275. When flip-flop 275 is set, a power-on reset signal is applied along line 269, through inverter 217, and along line 207. The output of flip-flop 275 along line 269 is also applied to OR gates 250 and 251, and inverter 253. The output of inverter 253 is applied along line 259 to OR gate 252.

Flip-flop 275 is reset along line 276 upon the clearing of flip-flop 274. The output of AND gate 265 is also applied to inverter 277. The output of inverter 277 is along line 278 for resetting flip-flop 274.

The signals applied along lines 254-256 are initially derived from the output of play logic 229 along the flag write line 237. The output along line 237 is applied to OR gate 241 and AND gate 244, and to AND gates 245 through 247. The other input to AND gates 244-247 are along line 242.

Figure 11:
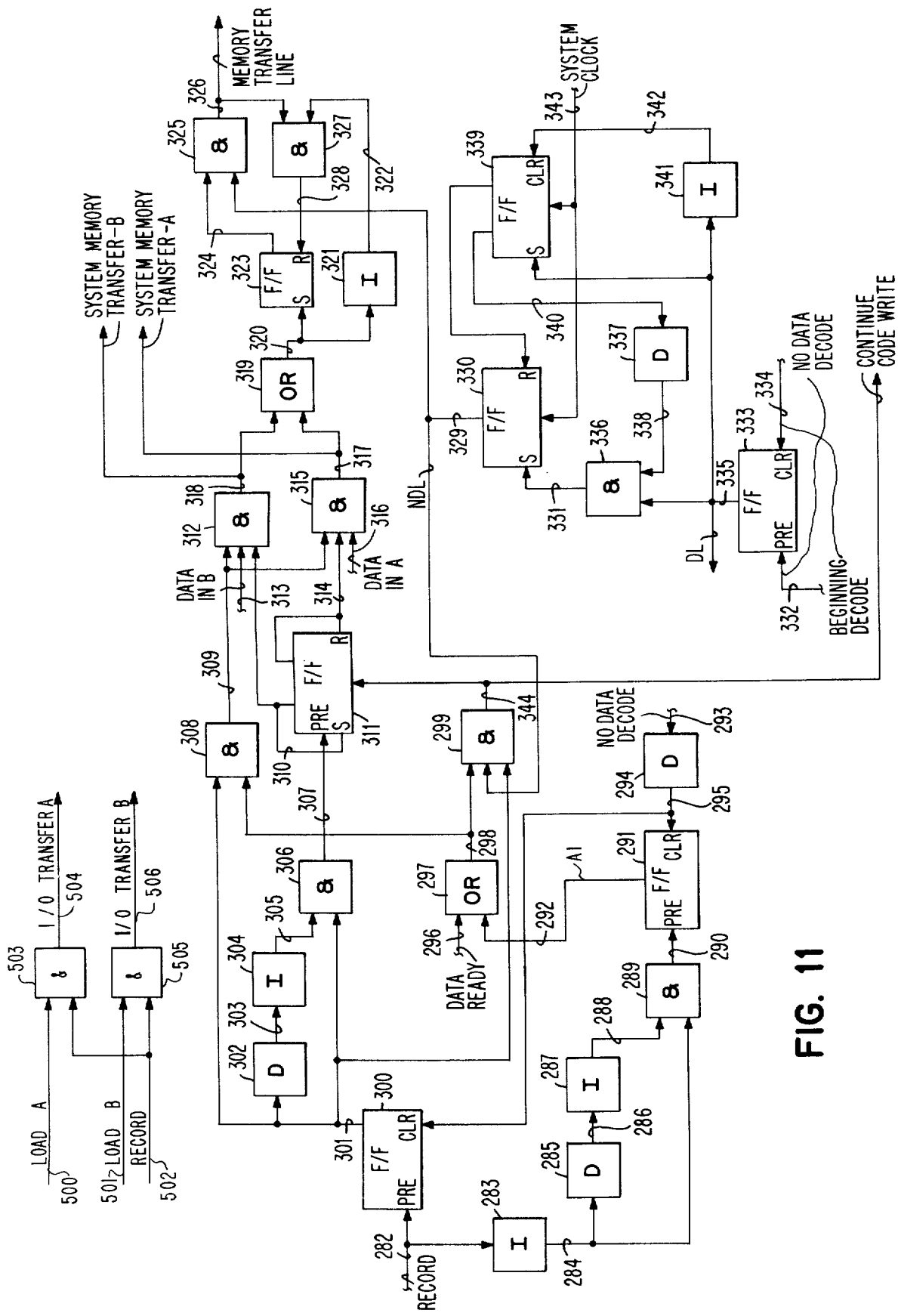
FIG. 11 sets forth the structure of the record logic of FIG. 10.

Referring next to FIG. 11, there is shown the structure of the record logic set out in FIG. 10. An incoming record signal is applied along line 282 for setting flip-flop 300. When flip-flop 300 is set a signal is applied along line 301 to one bit delay 302 and to AND gate 306. The other input to AND gate 306 is from one bit delay 302, along line 303, through inverter 304, and along line 305. The output from flip-flop 300 is also applied along line 301 to AND gates 308 and 299. The other input to AND gate 308 is the data ready signal applied along line 296, through OR gate 297, and along line 298. The signal applied along line 298 is also applied to AND gate 299. The output of AND gate 308 is along line 309 to AND gates 312 and 315. The output of AND gate 306 is along line 307 for presetting flip-flop 311.

When a no data decode signal is applied along line 332, flip-flop 333 will be set. The output of flip-flop 333 is along line 335 to AND gate 336. The output of flip-flop 333 along line 335 is also applied to flip-flop 339 and inverter 341. Flip-flop 339 will be set following the setting of flip-flop 333 when a system clock signal is applied along line 343. When flip-flop 339 is set, a signal is applied along line 340, through one bit delay 337, and along line 338 to AND gate 336. The output of AND gate 336 is applied along line 331 to flip-flop 330. This signal in conjunction with the system clock signal applied along line 343 will result in the setting of flip-flop 330. With flip-flop 330 set, a signal is applied along line 329 to AND gate 299. The output of AND gate 299 is along the continue code write line 344, and to flip-flop 311 for setting flip-flop 311. With flip-flop 311 set, a signal is applied along line 310 to AND gate 312. An output is also applied to AND gate 312 when flip-flop 311 is preset. The remaining input to AND gate 312 is the data in B signal applied along line 313. The output of AND gate 312 is along the system memory transfer B line 318 and to OR gate 319. The output of OR gate 319 is along line 320 to flip-flop 323. Flip-flop 323 will then be set upon the system clock input along line 343. With flip-flop 323 set, a signal is applied along line 234 to AND gate 325. The other input to AND gate 325 is from flip-flop 330 along line 329. The output of AND gate 325 is along the memory transfer line 326 and to AND gate 327. The other input to AND gate 327 is along line 320, through inverter 321, and along line 322. The output of AND gate 327 is along line 328 for resetting flip-flop 323.

When flip-flop 311 is reset, a signal is applied along line 314 to AND gate 315. When flip-flop 311 is cleared, an output is also applied to AND gate 315. The other input to AND gate 315 is the data in A signal applied along line 316. The output of AND gate 315 is along the system memory transfer A line 317 and input to OR gate 319.

The input for clearing flip-flop 333 is the beginning decode signal applied along line 334. The output of flip-flop 333 is also applied along line 335 to inverter 341. The output of inverter 341 is applied along line 342 for clearing flip-flop 339. When flip-flop 339 is cleared, a signal is applied to flip-flop 330 for resetting it.

Referring again to the incoming record signal along line 282, this is applied to inverter 283, and along line 284 to one bit delay 285 and AND gate 289. The other input to AND gate 289 is applied along line 284, through one bit delay 285, along line 286, through inverter 287, and along line 288. The output of AND gate 289 is along the set line 290 to flip-flop 291. When flip-flop 291 is set, a signal is applied along the A1 line 292 to OR gate 297. When a signal is applied along the no data decode line 293 to one bit delay 294, a signal is output therefrom along line 295 for resetting flip-flop 291. The signal applied along line 295 is also applied to flip-flop 300 for resetting it.

The record signal applied along line 282 is also applied along line 502 to AND gates 503 and 505. The other input to AND gate 503 is along the load A line 500. The other input to AND gate 505 is along the load B line 501. The output from AND gate 503 is along the I/O transfer A line 504, and the output from AND gate 505 is along the I/O transfer B line 506.

Figure 12:
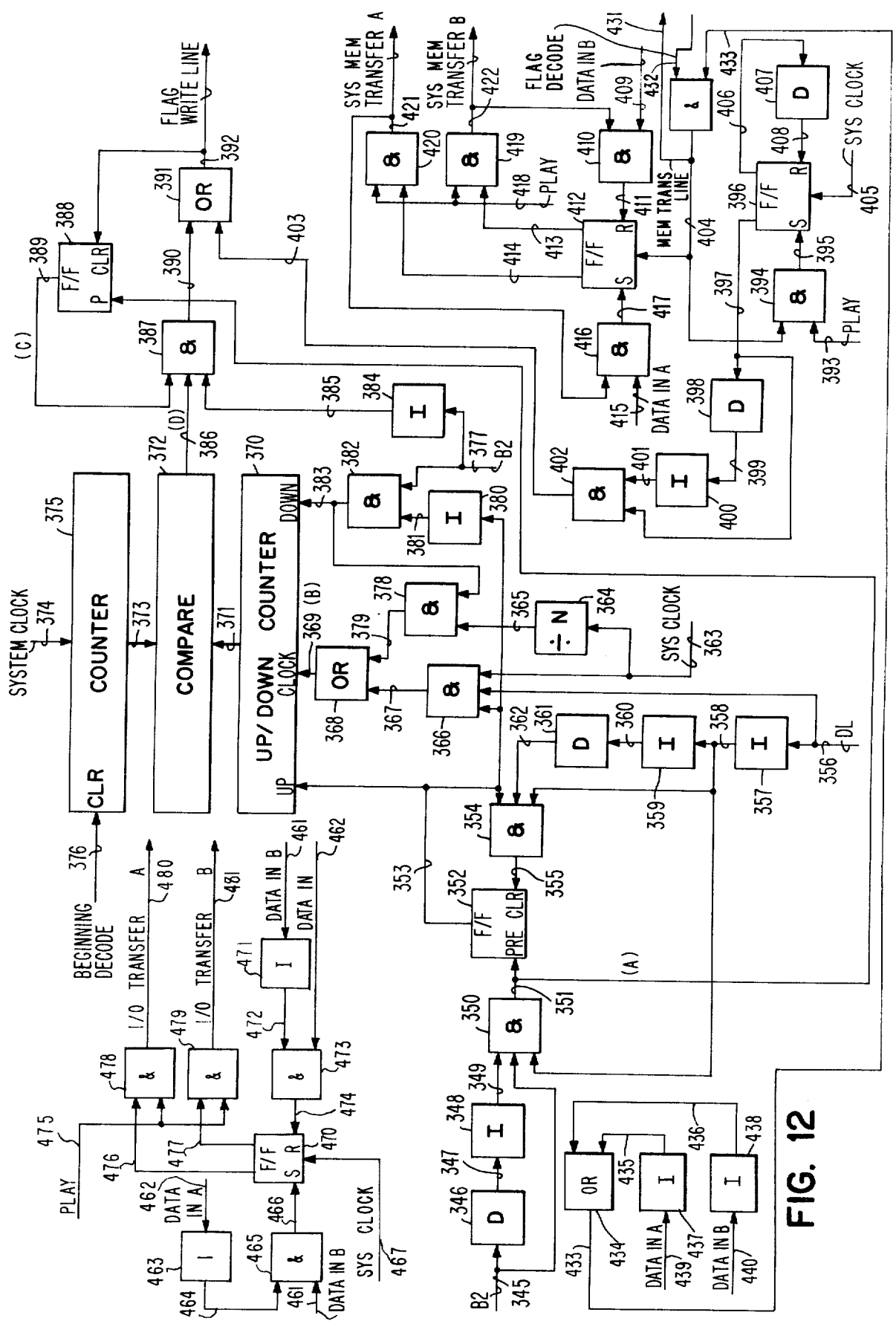
FIG. 12 sets forth the structure included in the play logic of FIG. 10.

Referring next to FIG. 12 there is illustrated the play logic designated by reference numeral 229 in FIG. 10. When the "two" button is depressed for initiating a playback or review operation, a signal is applied along line 345 to one bit delay 346. This signal is also applied to AND gate 350. The output of one bit delay 346 is applied along line 347 to inverter 348, and then along line 349 to AND gate 350. The other input to AND gate 350 originates from the data line 356 to inverter 357. The output of inverter 357 is applied along line 348 to AND gate 350. The output of AND gate 350 is applied along the set line 351 to flip-flop 352. When flip-flop 352 is set, a signal is applied along line 353 for incrementing up-down counter 370. The count in counter 370 is compared with the count in resettable counter 375. Clock signals from the system clock are applied along line 374 to counter 375. Counter 375 is reset or cleared upon the application of a beginning decode signal applied along line 376. The count in counter 375 is applied to compare 372 along line 373. The output of counter 370 is applied to compare 372 along line 371. The result of the compare operation in compare 372 is applied along the D line 386 to AND gate 387.

Another input to AND gate 387 is along the B2 line 377 to inverter 384 and then along 385. An input on the B2 line 377 is also applied to AND gate 382. The other input to AND gate 382 is derived from the output of flip-flop 352 applied along line 353 to inverter 380. The output of inverter 380 is applied along line 381 to AND gate 382. The output of AND gate 382 is along line 383 for decrementing up-down counter 370. The output of AND gate 382 is also applied to AND gate 378. The other input to AND gate 378 is derived from the system clock signals applied along line 363, through divider 364, and along line 365. The output of AND gate 378 is applied to OR gate 368 along line 379. the output of OR gate 368 is applied along the B line 369 for clocking counter 370. The system clock pulses are also applied along line 363 to AND gate 366. Another input to AND gate 366 is the output of flip-flop 352 along line 353. Yet another input into AND gate 366 is along the data line 356. The output of AND gate 366 is along 367 to OR gate 368, and then along line 369 for clocking up-down counter 370. The input appearing on data line 356 and inverted by inverter 357 is applied along line 358 to AND gate 354 and inverter 359. The output of inverter 359 is applied along line 360 to one bit delay 361, and then along line 362 to AND gate 354. The other input to AND gate 354 is from flip-flop 352 along line 353. The output of AND gate 354 is along the reset line 355 to flip-flop 352.

The output of AND gate 350 along line 351 is also applied along the A line to flip-flop 388. This is the set line for flip-flop 388. The output of flip-flop 388 is applied along the C line 389 to AND gate 387. The output of AND gate 387 is along line 390 to OR gate 391 and then along the flag write line 392. This output is also applied along the reset line to flip-flop 388.

The play line 393 is applied to AND gate 394. The other input to AND gate 394 is along line 404 from AND gate 430. An input to AND gate 430 is along the flag decode line 432. The other input to AND gate 430 is along line 433 from OR gate 434. One input to OR gate 434 is along the data in A line 439, through inverter 437, and along line 435. The other input to OR gate 434 is along the data in B line 440, through inverter 438, and along line 436. The output from AND gate 430 is also applied along the memory transfer line 431.

The output of AND gate 394 is along the set line 395 to flip-flop 396. The setting of flip-flop 396 is partially controlled by an input along the system clock line 405. Upon the setting of flip-flop 396, an output is applied along line 397 to one bit delay 398 and AND gate 402. The output of one bit delay 398 is along line 399 to inverter 400, and then along line 401 to AND gate 402. The output of AND gate 402 is applied along line 403, through OR gate 391, and then along the flag write line 392. When flip-flop 396 is reset, an output is applied along line 406 to one bit delay 407, and then along the reset line 408 to flip-flop 396.

The setting of flip-flop 412 is partially controlled by the output along line 404 from AND gate 430. When flip-flop 412 is set, an output is applied along line 414 to AND gate 420. The other input to AND gate 420 is along the play line 418. The output of AND gate 420 is along the system memory transfer A line 421 and to AND gate 416. The other input to AND gate 416 is along the data in A line 415. The output of AND gate 416 is along set line 417 to flip-flop 412. When flip-flop 412 is reset, an output is applied along line 413 to AND gate 419. The other input to AND gate 419 is along the play lie 418. The output of AND gate 419 is along the system memory transfer B line 422 and to AND gate 410. The other input to AND gate 410 is along the data in B line 409. The output of AND gate 410 is along the reset line 411 to flip-flop 412.

Referring to the upper left hand corner of FIG. 12, on input to AND gate 465 is along the data in B line 461. The other input to AND gate 465 is along the data in A line 462, through inverter 463, and along line 464. The output from AND gate 465 is applied along the set line 466 to flip-flop 470. The setting of flip-flop 470 is partially controlled by an input along the system clock line 467.

When flip-flop 470 is set, an output is applied along line 476 to AND gate 478. The other input to AND gate 478 is along the play line 475. The output from AND gate 478 is along the I/O transfer A line 480.

One input to AND gate 473 is along the data in A line 462. The other input to AND gate 473 is along the data in B line 461, through inverter 471, and along line 472. The output from AND gate 473 is along the reset line 474 to flip-flop 470.

When flip-flop 470 is reset, an output is applied along line 477 to AND gate 479. The other input to AND gate 479 is along the play line 475. The output from AND gate 479 is along the I/O transfer B line 481.

Although various components and interconnections therebetween have been generally described with reference to FIGS. 10–12, the operations performed thereby are illustrated in the timing diagrams of FIGS. 13, 14, and 15.

FIG. 13 illustrates the timing for operations performed during power-on. As illustrated, the index registers are initially loaded with "no data" codes, and then a beginning code in input and written over a no data code. FIG. 13, is therefore, an illustration of the timing of the operations performed by the structure set out in FIG. 10.

FIG. 14 is an illustration of the timing involved in performing a recording operation with the structure set out in FIG. 11. Included is the timing for transfer within the bubble memory from the major loops to the minor loops.

FIG. 15 is an illustration of the timing involved in performing a play or review operation with the structure set out in FIG. 12. Included are (1) a review time proportional to the time a button is depressed, (2) the writing of a flag control code into the index registers for play or review, and (3) the advancing of the flag control code during playout.

In summary, an electronic dictation apparatus is provided for storing and retrieving audio information without recording and play delays and media handling requirements. The apparatus is primarily made up of an A/D converter, a D/A converter, two limited capacity electronic registers, an electronic primary store and included index register, and an electronic control unit. During a recording operation, incoming audio information from an operator station is converted to digital information by the A/D converter and transferred to an available one of the limited capacity registers. When the capacity of one of the limited capacity registers is reached, the contents thereof are transferred to the primary store and indexed. During this transfer, the other limited capacity register is loaded with succeeding incoming information. That is, the two limited capacity registers are alternately loaded and unloaded.

The control of the loading and unloading of the limited capacity registers is through the control unit. When a transcribing operation is to be performed, the information stored in the primary store is alternately transferred to the limited capacity registers under the control of the control unit. During the loading of one of the limited capacity registers, the contents of the other can be transferred to the D/A converter for converting the information back into audio information for output to the operator station.

While the invention has been particularly shown and described with reference to a particular embodiment, it will be understood by those skilled in the art that various changes in form and detail may be made without departing from the spirit and scope of the invention.

What is claimed is:

1. A dictation system comprising:
   a. receiving means for receiving information input into said system in audio form;
   b. converting means for converting information received by said receiving means in audio form to digital form;
   c. first and second storage means for storing information received in audio form by said receiving means and converted to digital form by said converting means;
   d. third storage means, for storing information transferred from said first and second storage means;
   e. fourth storage means, being a bulk store such as a recording belt, for storing information transferred from said first and second storage means;
   f. transfer means for 1) transferring information converted by said converting means alternately to said first and second storage means at a first clock rate, and 2) alternately transferring information stored in said first and second storage means out of said first and second storage means and to said third storage means at a second clock rate for immediate processing: and;
   g. control means for causing information alternately transferred out of said first and second storage means by said transfer means to be transferred to said fourth storage means at said second clock rate for more permanent storage.

2. A system according to claim 1 wherein said means for transferring information alternately to said first and second storage means includes means for transferring information to an available one of said first and second storage means until the capacity thereof is reached.

3. A system according to claim 2 including determining means for determining (1) an available one of said first and second storage means, and (2) when the capacity of said first and second storage means is reached.

4. A system according to claim 3 wherein said determining means includes fifth and sixth storage means of equal capacity to said first and second storage means.

5. A system according to claim 1 including means for transferring information stored in said third storage means alternately to said first and second storage means at said second clock rate.

6. A system according to claim 5 wherein said means for transferring information stored in said third storage means to said first and second storage means includes means for transferring information to an available one of said first and second storage means until the capacity thereof is reached.

7. A system according to claim 6 including determining means for determining (1) an available one of said first and second storage means, and (2) when the capacity of said first and second storage means is reached.

8. A system according to claim 7 wherein said determining means includes fifth and sixth storage means of equal capacity to said first and second storage means.

9. A system according to claim 5 including means for alternately transferring information stored in said first and second storage means out of said first and second storage means at said first clock rate and to said converting means for converting said information to audio form from digital form.

10. A system according to claim 9 wherein said receiving means includes means for outputting information from said system in audio form.

11. A system according to claim 2 including index means for indexing information transferred from said first and second storage means to said third storage means.

12. A dictation system comprising:
   a. converting means for converting information input into said system in audio form to digital form;
   b. first and second storage means for storing information input in audio form and converted to digital form by said converting means;
   c. third storage means for storing information transferred from said first and second storage means;
   d. determining means, including forth and fifth storage means of equal capacity to said first and second storage means, for determining (1) an available one of said first and second storage means, and (2) when the capacity of said first and second storage means is reached; and
   e. means for (1) transferring information converted by said converting means alternately to said first and second storage means at a first clock rate until the capacity thereof is reached, and (2) alternately transferring information stored in said first and second storage means out of said first and second storage means and to said third storage means at a second clock rate.

13. A system according to claim 12 including means for transferring information stored in said third storage means alternately to said first and second storage means at said second clock rate.

14. A system according to claim 13 wherein said means for transferring information stored in said third storage means to said first and second storage means includes means for transferring information to an available one of said first and second storage means until the capacity thereof is reached.

15. A system according to claim 14 including receiving means for receiving information input into said system in audio form.

16. A system according to claim 14 including index means for indexing information transferred from said first and second storage means to said third storage means.

17. A system according to claim 14 including means for alternately transferring information information stored in said first and second storage means out of said first and second storage means at said first clock rate and to said converting means for converting said information to audio form from digital form.

18. A system according to claim 15 wherein said receiving means includes means for outputting information from said system in audio form.

* * * * *